US010958097B2

(12) United States Patent
Coleman

(10) Patent No.: US 10,958,097 B2
(45) Date of Patent: Mar. 23, 2021

(54) POWER SOURCE SELECTION

(71) Applicant: CommScope Technologies LLC, Hickory, NC (US)

(72) Inventor: Daryl A. Coleman, Winchester, VA (US)

(73) Assignee: CommScope Technologies LLC, Hickory, NC (US)

(*) Notice: Subject to any disclaimer, the term of this patent is extended or adjusted under 35 U.S.C. 154(b) by 16 days.

(21) Appl. No.: 16/462,252

(22) PCT Filed: Nov. 30, 2017

(86) PCT No.: PCT/US2017/063873
§ 371 (c)(1),
(2) Date: May 20, 2019

(87) PCT Pub. No.: WO2018/118370
PCT Pub. Date: Jun. 28, 2018

(65) Prior Publication Data
US 2019/0341804 A1 Nov. 7, 2019

Related U.S. Application Data

(60) Provisional application No. 62/438,365, filed on Dec. 22, 2016.

(51) Int. Cl.
*H02J 9/06* (2006.01)
*G06F 1/26* (2006.01)
(Continued)

(52) U.S. Cl.
CPC .............. *H02J 9/061* (2013.01); *G06F 1/263* (2013.01); *H02J 1/102* (2013.01); *H03K 17/122* (2013.01)

(58) Field of Classification Search
CPC ...................................................... H02J 9/061
See application file for complete search history.

(56) References Cited

U.S. PATENT DOCUMENTS 4,730,121 A * 3/1988 Lee .................... H02J 9/061
307/64
5,517,153 A 5/1996 Yin et al.
(Continued)

OTHER PUBLICATIONS

European Patent Office, "Extended European Search Report from EP Application No. 17883035.2", from Foreign Counterpart to U.S. Appl. No. 16/462,252, dated Apr. 6, 2020, pp. 1 through 9, Published: EP.
(Continued)

*Primary Examiner* — Hai L Nguyen
(74) *Attorney, Agent, or Firm* — Fogg & Powers LLC

(57) ABSTRACT

A circuit for selecting between a primary power source and a back-up power source is provided in one embodiment. The circuit includes a first port configured to be coupled to a primary power source, a second port configured to be coupled to a back-up power source, a third port configured to be coupled to provide power to a load. The circuit also includes first and second power field effect transistors (FET) coupled between the second port and the third port, a third power FET coupled between the first port and the third port, and a dual ideal diode-OR controller coupled between the second and third power FETs to selectively turn on and off the second and third power FETs. The circuit further includes an opto-isolator coupled to a control input of the first power FET and a controller, coupled to the opto-isolator, that selectively turns on and off the opto-isolator.

21 Claims, 5 Drawing Sheets

(51) Int. Cl.
*H02J 1/10* (2006.01)
*H03K 17/12* (2006.01)

(56) References Cited

U.S. PATENT DOCUMENTS

| | | | |
|---|---|---|---|
| 5,610,451 A | 3/1997 | Symonds | |
| 6,330,176 B1 * | 12/2001 | Thrap | H02J 3/005 307/86 |
| 6,552,599 B1 | 4/2003 | Xu | |
| 7,550,834 B2 * | 6/2009 | Yu | H01L 25/0657 257/686 |
| 7,804,282 B2 | 9/2010 | Bertele | |
| 8,022,679 B2 | 9/2011 | Sachdev et al. | |
| 10,128,685 B2 | 11/2018 | Hanley | |
| 2008/0019155 A1 | 1/2008 | Morishima et al. | |
| 2012/0044014 A1 | 2/2012 | Stratakos et al. | |
| 2014/0084687 A1 | 3/2014 | Dent | |

OTHER PUBLICATIONS

International Searching Authority, "International Search Report and Written Opinion from PCT Application No. PCT/US2017/063873 dated Mar. 30, 2018", pp. 1-19, Published: WO.

Linear Technology, "Demo Manual DC2180A LTC4371 Dual Negative Voltage Ideal Diode-Or Controller", 2016, pp. 1-6, Linear Technology Corporation.

Linear Technology, "LTC4371 Dual Negative Voltage Ideal Diode-OR Controller and Monitor", 2016, pp. 1-22, Linear Technology Corporation.

\* cited by examiner

POWER SOURCE SELECTION

This application is a 371 National Stage application of International Patent Application No. PCT/US2017/063873 filed on Nov. 30, 2017, which claims the benefit of U.S. Provisional Patent Application No. 62/438,365 filed on Dec. 22, 2016, the contents of both of which are hereby incorporated in their entirety.

BACKGROUND

Electronic circuits require power for proper operation. This power may be provided by any appropriate source, such as a rectifier, a battery, a solar cell, a fuel-cell, and the like. If the power source is interrupted or lost, the electronic circuit will cease to function. In many systems, users of these electronic circuits expect that the system will continue to function at all times. Therefore, many electronic systems also provide a backup power source that is connected to the electronic circuit in the event of a failure in the primary power source.

There are many conventional approaches for switching between the primary power source and the backup power source for an electronic circuit. For example, some systems use mechanical relays to switch from the primary power source to backup power when the primary power source becomes unavailable. Other systems use field effect transistors (FET) only based solid-state switches, or wired or ideal diode-OR components. Many of these systems use a break-then-make switching technology which interrupts the power to load for the switching interval, and/or experience voltage level limitations, slow response times and high transients.

Therefore, there is a need in the art for an improved circuit for switching between a primary power source and a backup power source.

SUMMARY

A circuit for selecting between a primary power source and a back-up power source is provided in one embodiment. The circuit includes a first port configured to be coupled to a primary power source, a second port configured to be coupled to a back-up power source, a third port configured to be coupled to provide power to a load. The circuit also includes first and second power field effect transistors (FET) coupled between the second port and the third port, a third power FET coupled between the first port and the third port, and a dual ideal diode-OR controller coupled between the second and third power FETs to selectively turn on and off the second and third power FETs. The circuit further includes an opto-isolator coupled to a control input of the first power FET and a controller coupled to the opto-isolator that selectively turns on and off the opto-isolator. The controller monitors the power received at the first port and, when the power at the first port crosses a first threshold level, turns on the opto-isolator so that power is transmitted by the first and second power transistors between the second port and the third port and when the power at the first port crosses a second threshold level, turns off the opto-isolator so that power is transmitted by the third power transistor between the first port and the third port.

DRAWINGS

Understanding that the drawings depict only exemplary embodiments and are not therefore to be considered limiting in scope, the exemplary embodiments will be described with additional specificity and detail through the use of the accompanying drawings, in which.

DETAILED DESCRIPTION

Figure 1:
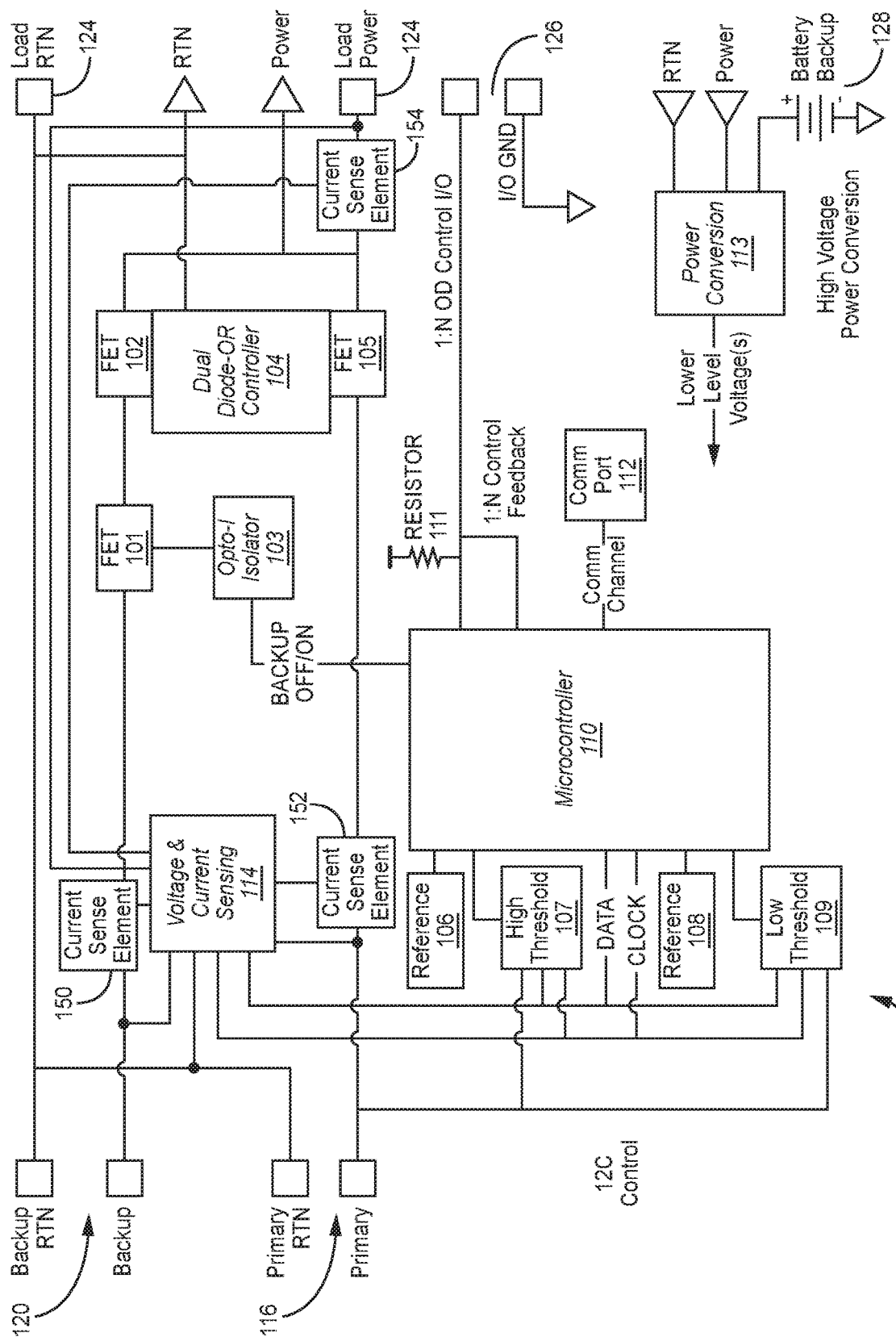
FIG. 1 is a block diagram of one embodiment of a circuit for switching between a primary power source and a backup power source according to the teachings of the present invention.

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

Embodiments of the present invention provide a capability to externally switch load power from a "primary" power source to a "backup" power source and from a "backup" power source to a "primary" power source without interruption to the operation of the load. In one embodiment, a circuit automatically detects a drop in primary power voltage and switches the load power input to a backup power source when the primary power source falls below a configurable threshold level. In another embodiment, the circuit automatically detects a rise in primary power voltage and switches load power from the backup power source back to the primary power source once the primary power source rises above a different, configurable threshold level. The power switching is completed in a smooth and fast manner such that the load does not experience sufficient voltage drop or current transients that would cause it to cease operating. This switching is accomplished independent of the relative voltage levels of the two power sources provided the backup voltage level is greater than the primary's falling threshold.

For pedagogical purposes, this specification generally describes the embodiments being connected to positive input and output voltage levels. It is understood, however, that other embodiments of this invention function in typical telecommunication applications that use negative voltages (e.g., −48V). For embodiments using negative input and load voltages, the terms "fall" or "drop" associated with an input voltage would indicate the voltage is going less negative; the term "rise" associated with a negative input voltage would indicate the voltage is going more negative. In light of this dual embodiment, the voltages levels as discussed in this specification are best viewed as absolute (rather than positive or negative) values.

FIG. 1 is a block diagram of one embodiment of a circuit, indicated generally at 100, for switching between a primary power source and a backup power source according to the teachings of the present invention. The circuit 100 includes two ports for receiving power. Primary power port 116 is configured to be coupled to a primary power source. Primary power port 116 has two nodes labelled Primary and Primary return (RTN), respectively. Backup power port 120 is adapted to be coupled to a backup power source and includes two nodes labelled Backup and Backup RTN, respectively. The circuit 100 also includes a port that is configured to provide power to a load. Load power port 124 includes two nodes labelled Load Power and Load RTN.

The circuit 100 includes two paths for providing power to the load. The first (primary) path includes power field effect transistor (FET) 105 coupled between primary power port 116 and load power port 124. The second path (back-up) includes power field effect transistors (FETs) 101 and 102 that are coupled in series between backup power port 120 and load power port 124. Advantageously, use of power transistors provides lower heat dissipation than diodes or mechanical relays used in conventional approaches due to the low inline "on" resistance of the power MOSFETS. Power MOSFETs are also smaller in size than mechanical components that carry equivalent current. Further, embodiments of the present invention provide enhanced reliability and faster response times resulting from using solid state technology rather than mechanical components.

The circuit 100 also includes a control circuit for switching between the primary power source and the backup power source. This control circuit includes microcontroller 110, opto-isolator 103 and dual-ideal-OR controller 104. Opto-isolator 103 is coupled between microcontroller 110 and a control input of FET 101. Microcontroller 110 provides control signals to turn on and off opto-isolator 103 as described in more detail below. Opto-isolator 103 bridges the gap between low voltage electronics in the microcontroller 110 and the higher voltage regime of the power FETs, e.g., FETs 101 and 102. Dual ideal diode-OR controller 104 is coupled to FET 102 and FET 105. Controller 104 alternatively turns on and off the power FETs 102 and 105 as described in more detail below.

Microcontroller 110 determines when to switch between the primary power source at primary power port 116 and the backup power source at backup power port 120. The microcontroller 110 accomplishes this by comparing the voltage of the primary power source at primary power port 116 against two thresholds, high threshold 107 and low threshold 109, as described in more detail below. In another embodiment, the microcontroller 110 could be replaced by discrete analog and/or digital logic performing the same functionality.

Circuit 100 also includes voltage and current sensing circuit 114. Voltage and current sensing circuit 114 gathers data on voltage and current in circuit 100 through current sense elements 150, 152, and 154. Current sense element 150 measures current from back-up power port 120. Current sense element 152 measures current from primary power port 116. Finally, current sense element 154 measure current at load power port 124. Voltage and current sensing can also be used to monitor power and expended energy. Circuit 114 allows the voltage and current levels of the backup and primary power sources to be monitored by microcontroller 110. Communication between voltage and current sensing circuit 114 and microcontroller 110 is accomplished by way of a two-wire interface. Communication schemes in other embodiments include Serial Peripheral Interface (SPI), Universal Serial Bus (USB) or circuit 114 can have analog outputs that connect to an analog to digital converter (ADC) internal to the microcontroller 110. In one embodiment, the voltage and current sensing circuit 114 can be used to detect faults, such as, overvoltage, under voltage, over current, low current, or the like.

Low threshold 109 and high threshold 107 used by microcontroller 110 may be adjusted through microcontroller 110 for a specific implementation. In one embodiment, the high and low voltage thresholds 107 and 109 are set by way of a two-wire interface connecting a variable voltage divider to microcontroller 110. In another embodiment, the high and low thresholds 107 and 109 are set by references 106 and 108 respectively. These embodiments for thresholds 107 and 109 could be implemented via a discrete reference voltage, a digital potentiometer, stored memory or, for fixed thresholds, a highly precise resistor array. This path provides a mechanism for setting the window to implement hysteresis as discussed in more detail below that prevents switching oscillation and instability.

Microcontroller 110 includes a communication (Comm) port 112. Comm Port 112 provides an interface to an external host that allows for the communication, monitoring and control of the voltages, currents and switching thresholds in circuit 100. Comm port 112 could be used to change switching thresholds 107 and 109, create an alarm when a switching event occurs, or provide feedback about the primary source voltage and current levels. This could be implemented as serial data (e.g., RS-232, RS-485), Ethernet, or discrete digital input/output lines. Advantageously, comm port 112 enables field site adjustments and real time monitoring of voltage and current levels to an external host not provided by current art. This comm port 112 allows for remote monitoring of voltage and current levels, e.g. at the base when circuit 100 is installed at the tower top.

Circuit 100 also includes power converter 113. Power converter 113 converts high voltage levels at, for example, load power port 124 to one or more lower level voltages needed by microcontroller 110 and other control functions in circuit 100. In other embodiments, power converter 113 may receive high voltage level input from primary power port 116 or back-up power port 120. In one embodiment, power converter 113 also includes a battery 128 that provides power to circuit 100 when no power is output at load power port 124. In this way, power converter 113 can provide power to microcontroller 110 and other low voltage circuitry (for example, voltage and current sensing circuit 114, high threshold 107, low threshold 109, reference 106, and reference 108) from battery 128 to configure and control circuit 100 in the absence of inputs at both primary power port 116 and backup power port 120 or failure of load port 124. In another embodiment, power converter 113 can also select between power inputs 120 and 116.

Figure 2:
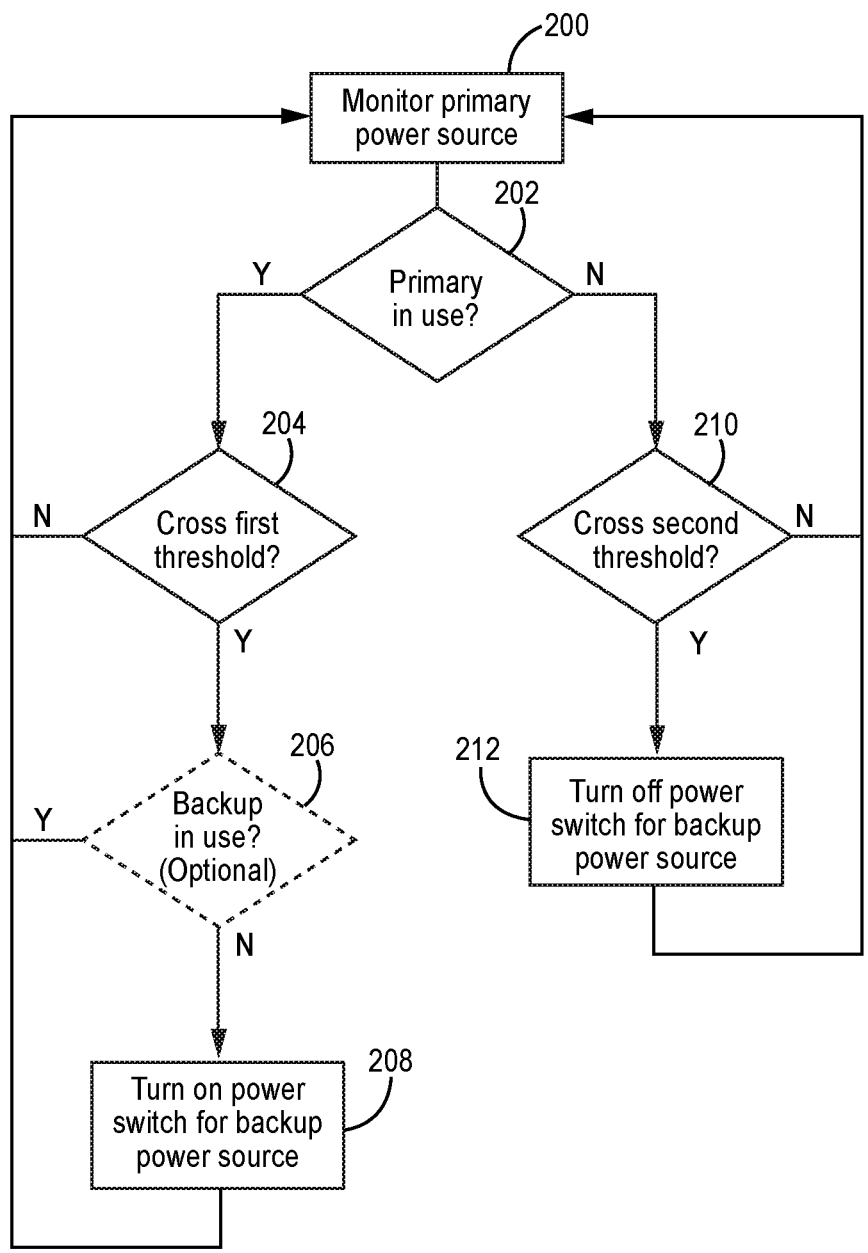
FIG. 2 is a flowchart of one embodiment of a method for switching between a primary power source and a backup power source according to the teachings of the present invention.

FIG. 2 is a flowchart on one embodiment of a method for switching between a primary power source and a backup power source according to the teachings of the present invention. The operation of circuit 100 will be described in conjunction with the process of FIG. 2. The process of FIG. 2 is divided into two paths at block 202. At block 202, it is determined whether the primary or back up power source is currently providing power for the load. If the primary power source is providing power, the process proceeds to block 204 to determine if the primary power source needs to be replaced by the backup power source. Otherwise, if the back-up power source is providing power to the load, the process proceeds to block 210 to determine if the primary power source is back on-line.

According to this process, circuit 100 normally supplies power to the load from the primary source. To accomplish this, microcontroller 110 turns opto-isolator 103 off which in turn keeps FET 101 off, physically disconnecting the backup power source from the load. When circuit 100 is in this condition as determined at block 202, the microcontroller 110 compares the primary source voltage to a first threshold, e.g., the low threshold 109 voltage value at block 204. This comparison determines whether the primary voltage is present and sufficient to power the load. If the primary power source has not crossed the first threshold, for example, has not dropped below the low threshold, then the process returns to block 200 and, with the backup source physically disconnected, the dual ideal diode-OR controller 104 enables FET 105 to drive power to the load from the primary power source. The process continues to monitor the primary power source at block 200.

A short, brown-out, other fault condition or deactivation may occur to the primary power source which causes its voltage level to cross the first threshold, e.g., fall below low threshold 109. This falling voltage level is detected by microcontroller 110 at block 204 and the process proceeds to optional block 206.

In an alternate embodiment discussed below, a backup power source is shared between N primary power sources. In such an embodiment, the circuit 100 does not switch to the backup power source if another of the N primary power sources has already been replaced by the backup power source. Thus, the process returns to block 200 and monitors the primary power source.

If however, the backup power source is not in use or the backup is not shared, the process proceeds to block 208. The Microcontroller 110 reacts by turning on opto-isolator 103 to enable power FET 101 once the first threshold is crossed, e.g., the voltage drops below the low threshold. Once enabled, power FET 101 allows voltage to pass to power FET 102. Since the backup voltage level will be higher than that of the primary voltage at its low threshold, the dual ideal diode-OR controller 104 will detect current flowing through the body diode of power FET 102 and switch load power to the backup by turning off power FET 105. It is noted that the design of circuit 100 has the benefit that the backup voltage can be higher or lower than the primary voltage without being switched to the load when not needed. This is not the case with an ideal diode-OR only solution that simply switches whichever voltage is the highest to the load.

This control mechanism provides a number of additional benefits over conventional circuits used to switch between primary and backup power sources. For example, circuit 100 provides smooth switching between power sources while reducing voltage and current transients. Large energy spikes associated with normal power switching are eliminated. Further, fast switching response time enabled by controller 110, opto-isolator 103 and FET 101 allows load power to be switched before the primary voltage level drops below the minimum required load voltage. This avoids a power loss to the load that would interrupt load operation. Additionally, embodiments of the invention act as a voltage prioritizer for voltages higher (up to 100V) than current prioritizers (up to 36V).

The process returns to block 200 and monitors the primary power source. Circuit 100 continues to supply load power from the backup once the primary source crosses the first threshold, e.g., falls below low threshold 109 until the primary source voltage level crosses a second threshold, e.g., rises above a high threshold 107. This technique implements hysteresis such that switching oscillation does not occur from a slow slew rate, noise or transients on the primary voltage as it is falling below low threshold 109. The use of programmable switching thresholds with inherent hysteresis facilitates easy and relatively wide adjustable thresholds and hysteresis to accommodate system noise and switching transients. Averaging and digital filtering could also be employed for a more robust hysteresis algorithm. Current art depends on resistor dividers or fixed values for threshold and hysteresis.

If the fault condition is cleared from the primary power source or the primary power source is reactivated causing its output voltage to rise, microcontroller 110 will detect this rising voltage as it crosses high threshold 107 at block 210. Once microcontroller 110 detects the primary voltage rising above high threshold 107, it proceeds to block 212 and shuts off opto-isolator 103 which in turn disables power FET 101. This effectively disconnects the backup power source to the load once again. Dual diode-OR controller 104, sensing current beginning to flow through the body diode of power FET 105 and current ebbing with voltage dropping and finally reversing in power FET 102, will enable power FET 105 and disable power FET 102. Load power has now been shifted back to the primary power source from the backup power source. The process returns to block 200 and monitors the primary power source.

Hysteresis protection against switching oscillation is also implemented once circuit 100 switches load power back to the primary by preventing another switch to the backup unless the primary voltage level once again falls below low threshold 109 using the process described above with respect to blocks 202, 204, 206, and 208.

Figure 3:
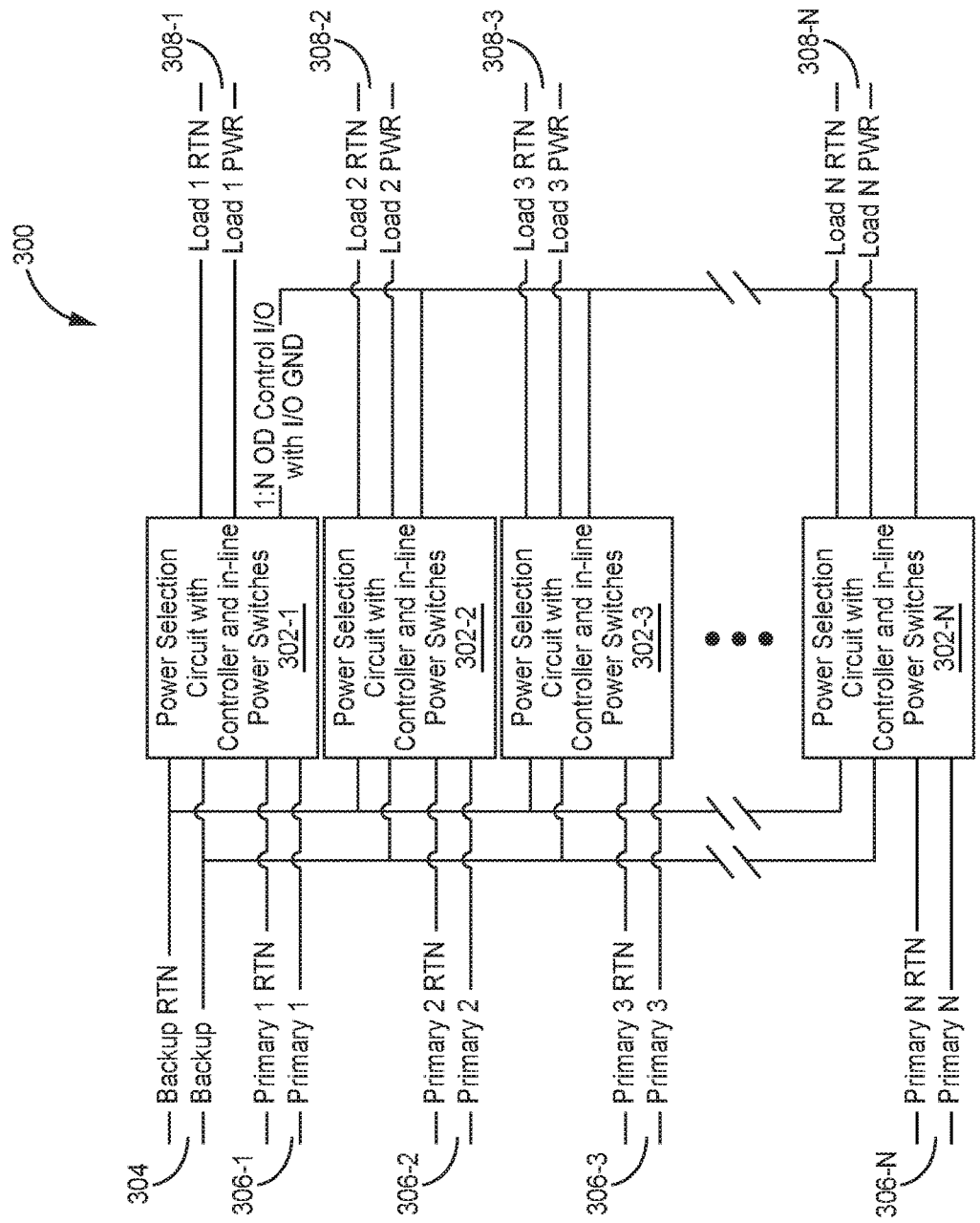
FIG. 3 is a block diagram of an embodiment of an electronic system including N circuits for switching between N primary power sources, each associated with a respective one of the N circuits, and a backup power source that is shared by the N circuits.

FIG. 3 is a block diagram of an embodiment of an electronic system, indicated generally at 300, including N circuits (302-1 to 302-N) that share one backup power source between N loads. Circuits 302-1 to 302-N each switch between their respective primary power source at primary power ports 306-1 to 306-N and a shared backup power source at backup power port 304. Advantageously, this embodiment of the invention enables backup switching for multiple, N, loads from a single backup power source or 1:N redundancy. This feature allows the backup power source at backup power port 304 to be switched to any one of "N" output loads at load power ports 308-1 to 308-N. Since the backup power source typically is insufficient to power multiple loads, the backup power source provides power to only one of the "N" loads at a time. In this embodiment, the switching of a backup source to one and only one of N multiple loads concurrently is accomplished through an "open drain" (drive low only) signaling technique as described below.

For 1:N redundancy configurations such as shown in FIG. 3, one power selection circuit 302 is needed per load. In one embodiment, the power selection circuit is implemented using the circuit 100 of FIG. 1. In a typical embodiment, individual, primary power sources are connected to the primary power ports 306-1 to 306-N of system 300. For backup power, the single, backup power port 304 couples the backup power source to the backup power source inputs of the power selection circuits 302.

Each power selection circuit 302 has a 1:N open-drain (OD) control I/O signal that is connected to all the power selection circuits 302. The OD control I/O signal is both an input and output of microcontroller 110 and serves to communicate the state of the backup control logic of the entire system 300. The driver for this signal in microcontroller 110 (FIG. 1) can either be disabled ("tri-stated") or driven low depending upon the state of the backup switch logic for all the individual power selection circuits. This OD control I/O signal is also wired back to microcontroller 110 as an input for monitoring the state of the OD control I/O signal. Monitoring can be accomplished with control logic implemented internal or external to the microcontroller 110.

During normal operation, the individual power selection circuits 302-1 to 302-N provide power to their loads from the individual primary power sources coupled to primary power ports 306-1 to 306-N, respectively. The backup source is physically disconnected in each of the power selection circuits 302-1 to 302-N and does not provide power to the power load node 308-1 to 308-N coupled to the respective power selection circuits 302-1 to 302-N as described above. Under these conditions, each power selection circuit 302-1 to 302-N will disable its OD control I/O driver and resistor 111 will pull this signal to a logic "high" indicating to all power selection circuits 302-1 to 302-N that no individual power selection circuit 302-1 to 302-N has switched to the backup power source.

In this redundancy embodiment, power selection circuits 302-1 to 302-N include the optional block 206 of FIG. 2. The function of block 206 is governed by the current state of the OD control I/O signal. At block 204, if microcontroller 110 detects the voltage level of the primary source falls below low threshold 109, then microcontroller 110 checks the state of the OD control I/O signal at block 206. If it is "high" as described above, microcontroller 110 not only activates opto-isolator 103 as described above with respect to block 208 but also drives its OD control I/O signal low. This communicates to all of the other power selection circuits 302 that one of the power selection circuits 302-1 to 302-N has switched to use the backup power source. If the state of the OD control I/O signal is low at block 206, then microcontroller 110 is prevented from activating its opto-isolator 103 at block 208 that would cause the output load to switch to the backup power source due to the fact that one of the other individual power selection circuits 302 has already switched its load to the backup power source.

Should the primary source voltage level of the redundant system that is switched to backup power rise back above high threshold 107 (block 210), then microcontroller 110 again "tri-states" the OD control I/O signal (at block 212). Resistor 111 will pull the OD control I/O signal back high allowing any of the power selection circuits 302 to switch to backup if their primary power source falls below low threshold 109.

Figure 4:
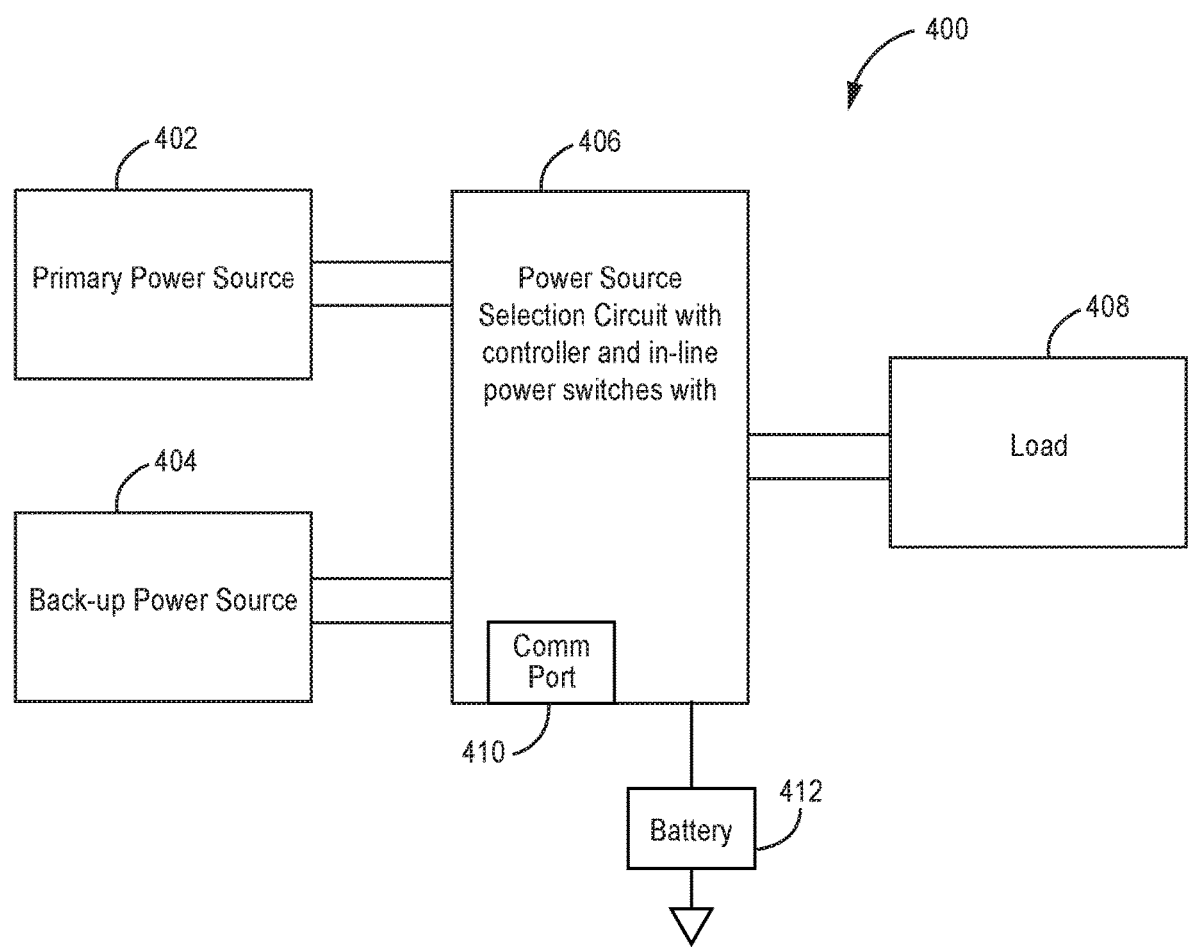
FIG. 4 is a block diagram of an embodiment of an electronic system that includes a circuit for selecting between a primary power source and a backup power source according to the teachings of the present invention.

FIG. 4 is a block diagram of an electronic system, indicated generally at 400, that includes a circuit 406 for selecting between a primary power source 402 and a backup power source 404 according to the teachings of the present invention. Circuit 406 is coupled to load 408, for example, telecommunications circuitry such as a remote radio head, remote unit of a distributed antenna system, or other appropriate electronic circuit. Circuit 406 also includes battery 412 to provide power to the circuit 406 to enable configuration and control of circuit 406 when primary power source 402 and backup power source 404 are not available or the output power port to load 408 has failed. Circuit 406 also includes comm port 410 to provide an interface for configuring circuit 406 in a similar manner to embodiments discussed above. Circuit 406 is configured to include in-line power switches controlled by low-voltage circuitry and an ideal-OR controller to enable fast, smooth switching to backup power source 404 when primary power source drops below a configurable threshold. Circuit 406 implements hysteresis to prevent switching oscillation from a slow slew rate, noise or transients on the primary voltage as it is falling below the threshold. In one embodiment, circuit 406 is configured as shown and described above with respect to FIG. 1.

In operation, circuit 406 selects between primary power source 402 and backup power source 404. When primary power source crosses a first threshold, e.g., drops below a selected voltage, circuit 406 selects backup power source 404 and passes this power to load 408. When the backup power source 404 is providing power to load 408, circuit 406 monitors primary power source 402 to determine when the primary power source 402 is back on-line. Circuit 406 determines when the primary power source 402 crosses a second threshold, e.g., rises above a second selected voltage. When this occurs, circuit 406 switches back to using primary power source 402 as the power source for the load 408.

Figure 5:
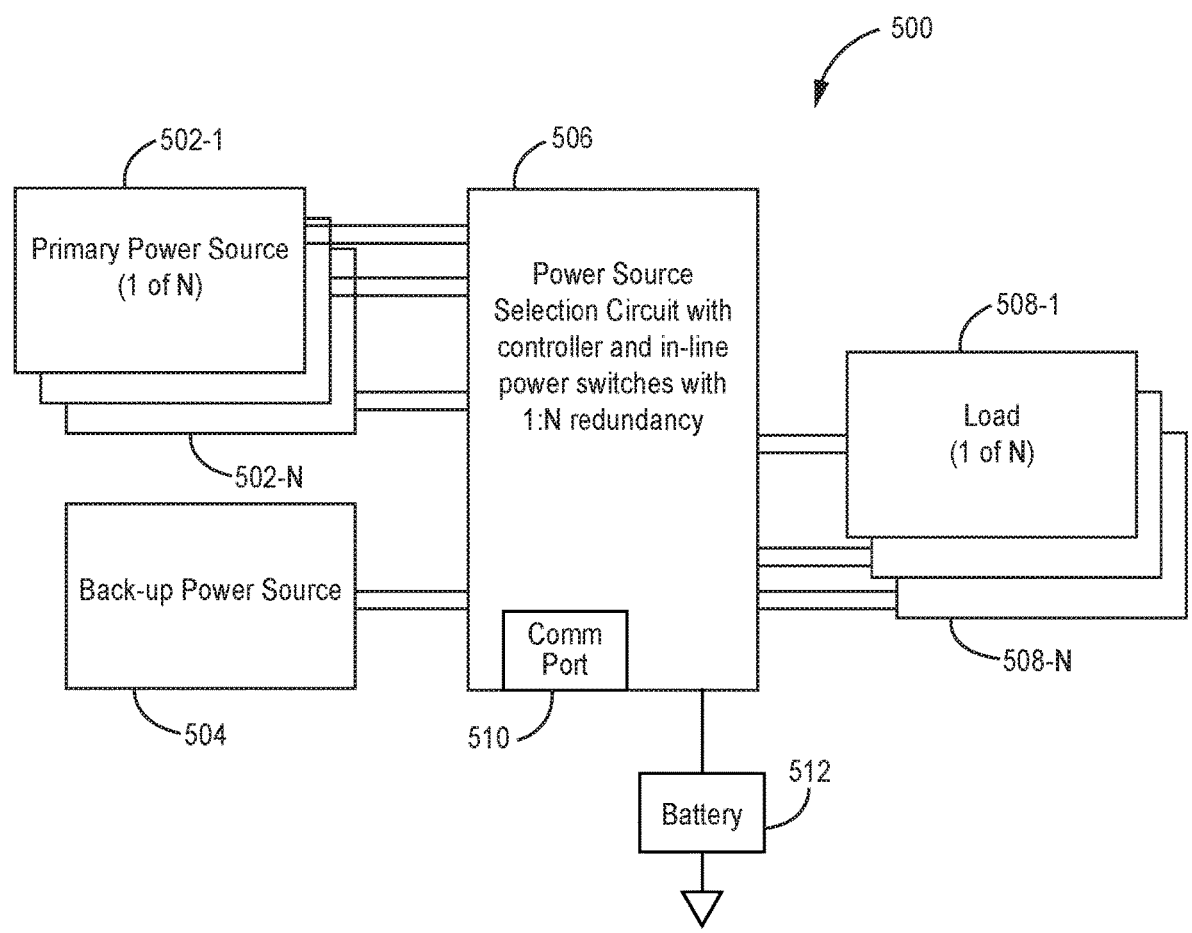
FIG. 5 is a block diagram of another embodiment of an electronic system that includes a circuit for selectively switching to one backup power source in place of one of N primary power sources to provide power to one of N respective loads.

FIG. 5 is a block diagram of another embodiment of an electronic system, indicated generally at 500, that includes a circuit 506 for selectively applying one backup power source 504 in place of one of N primary power sources 502-1 to 502-N to one of N respective to loads 508-1 to 508-N, for example, telecommunications circuitry such as a remote radio head, remote unit in a distributed antenna system or other appropriate electronic circuits. Circuit 506 also includes battery 512 to provide power to the circuit 506 to be used to provide power to circuit 506 to enable configuration and control of circuit 506 if load power is unavailable due to power output failure or if primary and backup power sources are not available. Circuit 506 also includes comm port 510 to provide an interface for configuring circuit 506. In one embodiment, power source selection circuit 506 is constructed as shown and described above with respect to FIGS. 1 and 3.

In operation, circuit 506 selects between primary power sources 502-1 to 502-N and backup power source 504. When one of the primary power sources 502-1 to 502-N crosses a first threshold, e.g., drops below a selected voltage level, circuit 506 selects backup power source 504 and passes this power to the corresponding load 508. Circuit 506 also sets a signal that indicates that the backup power source 504 is currently in use. This signal is used to prevent the backup power source 504 from being switched to any of the other N loads. When the backup power source 504 is providing power to one of N loads 508-1 to 508-N, circuit 506 monitors the primary power source 502 that was switched out to determine when the primary power source 502 is back on-line. Circuit 506 determines when the primary power source 502 is back online when the power supplied by the primary power source 502 crosses a second threshold, e.g., rises above a second selected voltage. When this occurs, circuit 506 switches back to using primary power source 502 as the power source for the corresponding one of loads 508-1 to 508-N and clears the signal indicating backup power is available.

EXAMPLE EMBODIMENTS

Example 1 includes a circuit for selecting between a primary power source and a back-up power source. The circuit includes a first port configured to be coupled to a primary power source, a second port configured to be coupled to a back-up power source, a third port configured to be coupled to provide power to a load, first and second power field effect transistors (FET) coupled between the second port and the third port, a third power FET coupled between the first port and the third port, a dual ideal diode-OR controller coupled between the second and third power FETs to selectively turn on and off the second and third power FETs, an opto-isolator coupled to a control input of the first power FET, a controller, coupled to the opto-isolator, that selectively turns on and off the opto-isolator, wherein the controller monitors the power received at the first port and, when the power at the first port crosses a first threshold level, turns on the opto-isolator so that power is transmitted by the first and second power transistors between the second port and the third port and when the power at the first port crosses a second threshold level, turns off the opto-isolator so that power is transmitted by the third power transistor between the first port and the third port.

Example 2 includes the circuit of example 1, wherein the controller includes a port that produces a signal that enables the circuit to share the backup power source in a 1:N redundancy arrangement.

Example 3 includes the circuit of any of examples 1 and 2, wherein the first and second thresholds have different, configurable values.

Example 4 includes the circuit of example 3, wherein the controller turns on the opto-isolator when the power at the first port, as measure by a voltage level at the first port, drops below a low voltage threshold.

Example 5 includes the circuit of example 4, wherein the controller turns off the opto-isolator when the power at the first port, as measured by a voltage level at the first port, crosses above a high voltage threshold that is above the low voltage threshold.

Example 6 includes the circuit of any of examples 1-5, and further comprising a voltage and current sensing circuit configured to sense at least the voltage or current at at least one of the first, second and third ports.

Example 7 includes the circuit of any of examples 1-6, and further comprising a communications port coupled to the controller that is configured to establish the first and second thresholds.

Example 8 includes the circuit of any of examples 1-7, and further including at least one of a discrete reference voltage, a digital potentiometer, stored memory or a highly precise resistor array that are configured to establish the first and second thresholds.

Example 9 includes the circuit of any of examples 8, and further comprising a power converter that is coupled to receive a high input voltage from at least one of the first, second and third ports and convert the voltage to one or more lower level voltages for use by at least the controller.

Example 10 includes the circuit of example 9, wherein the power converter further includes a battery port that is configured to be coupled to a battery to provide power to the controller and other low voltage devices in the absence of a voltage at the first, second and third ports.

Example 11 includes a system that includes a load, a primary power port configured to be coupled to a primary power source, a back-up power port configured to be coupled to a back-up power source, a power source selection circuit, coupled to the load and the primary and back-up power ports. The power source selection circuit includes at least one power field effect transistor in a first path between the primary power port and the load, at least two power field effect transistors in a second path between the back-up power port and the load, a voltage and current sensing circuit, and a controller, coupled to one of the power field effect transistors in the first path and the voltage and current sensing circuit, wherein the controller is configured to selectively connect the back-up power source to the load by turning on and off the one of the power field effect transistors in the first path in response to the output of the voltage and current sensing circuit.

Example 12 includes the system of example 11, wherein the load comprises one of telecommunications circuitry, a remote radio head, remote unit or other circuitry in a distributed antenna system.

Example 13 includes the system of any of examples 11 and 12, and further comprising a dual diode-OR controller configured to selectively turn on and off the at least one power field effect transistor in the first path and the other of the at least two power field effect transistors in the second path.

Example 14 includes the system of any of examples 11-13, and further including a communications port coupled to the controller, the communications port configured to receive inputs that establish thresholds used by the controller to determine when to turn on and off the one of the power field effect transistors in the first path.

Example 15 includes the system of any of examples 11-14, wherein the load comprises a plurality of loads, the primary power port comprises a plurality of primary power ports, each of the primary power ports associated with a corresponding one of the plurality of loads, and the power source selection circuit selectively connects the back-up power source to one of the plurality of loads in response to a sensed condition of the corresponding primary power source.

Example 16 includes a method for selecting a power source for a load. The method includes monitoring the primary power source, when the primary power source is providing power to the load, determining if a condition of the primary power source crosses a first threshold, when the condition crosses the first threshold, turning on a first power field effect transistor to couple a back-up power source to the load through a second power field effect transistor, when the primary power source is not providing power to the load, determining if a condition of the primary power source crosses a second threshold, when the condition crosses the second threshold, switching off the first power field effect transistor to couple the primary power source to the load through a third power field effect transistor.

Example 17 includes the method of example 16, wherein monitoring the primary power source comprises monitoring a voltage level of the primary power source.

Example 18 includes the method of example 17, wherein determining if a condition of the primary power source crosses a first threshold comprises determining when a voltage of the primary power source drops below a low voltage threshold.

Example 19 includes the method of example 18, wherein determining if a condition of the primary power source crosses a second threshold comprises determining when a voltage of the primary power source rises above a high voltage threshold that is higher than the low voltage threshold.

Example 20 includes the method of any of examples 16-19, wherein turning on the first power field effect transistor comprises turning on the first power field effect transistor with an opto-isolator.

Example 21 includes the method of any of examples 16-20, and further comprising determining if the back-up power source is providing power to another load prior to turning on the first power field effect transistor.

Example 22 includes a system for providing sharing a common back-up power source for N loads. The system includes a back-up power port configured to be coupled to the common back-up power source, a plurality of primary power ports configured to be coupled to N primary power sources, a plurality of power selection circuits, each coupled to the common back-up power source and at least one of the plurality of primary power ports, a plurality of load ports, each coupled to one of the plurality of power selection circuits and configured to be coupled to provide power to one of the N loads, a control line, coupled to each of the plurality of power selection circuits, to communicate when one of the N power selection circuits is coupling the back-up power source to its load. Each of the power selections circuits includes a first port configured to be coupled to one of the N primary power sources, a second port configured to be coupled to the common back-up power source, a third port configured to be coupled to provide power to one of the N loads, first and second power field effect transistors (FET) coupled between the second port and the third port, a third power FET coupled between the first port and the third port, a dual ideal diode-OR controller coupled between the second and third power FETs to selectively turn on and off the second and third power FETs, an opto-isolator coupled to a control input of the first power FET, and a controller, coupled to the opto-isolator, that selectively turns on and off the opto-isolator. The controller monitors the power received at the first port and, when the power at the first port crosses a first threshold level, turns on the opto-isolator so that power is transmitted by the first and second power transistors between the second port and the third port and when the power at the first port crosses a second threshold level, turns off the opto-isolator so that power is transmitted by the third power transistor between the first port and the third port.

A number of embodiments of the invention defined by the following claims have been described. Nevertheless, it will be understood that various modifications to the described embodiments may be made without departing from the spirit and scope of the claimed invention. Accordingly, other embodiments are within the scope of the following claims.

What is claimed is:

1. A circuit for selecting between a primary power source and a back-up power source, the circuit comprising:
   a first port configured to be coupled to a primary power source;
   a second port configured to be coupled to a back-up power source;
   a third port configured to be coupled to provide power to a load;
   first and second power field effect transistors (FET) coupled between the second port and the third port;
   a third power FET coupled between the first port and the third port;
   a dual ideal diode-OR controller coupled between the second and third power FETs to selectively turn on and off the second and third power FETs;
   an opto-isolator coupled to a control input of the first power FET;
   a controller, coupled to the opto-isolator, that selectively turns on and off the opto-isolator;
   wherein the controller monitors the power received at the first port and, when the power at the first port crosses a first threshold level, turns on the opto-isolator so that power is transmitted by the first and second power transistors between the second port and the third port and when the power at the first port crosses a second threshold level, turns off the opto-isolator so that power is transmitted by the third power transistor between the first port and the third port.

2. The circuit of claim 1, wherein the controller includes a port that produces a signal that enables the circuit to share the backup power source in a 1:N redundancy arrangement.

3. The circuit of claim 1, wherein the first and second thresholds have different, configurable values.

4. The circuit of claim 3, wherein the controller turns on the opto-isolator when the power at the first port, as measure by a voltage level at the first port, drops below a low voltage threshold.

5. The circuit of claim 4, wherein the controller turns off the opto-isolator when the power at the first port, as measured by a voltage level at the first port, crosses above a high voltage threshold that is above the low voltage threshold.

6. The circuit of claim 1, and further comprising a voltage and current sensing circuit configured to sense at least the voltage or current at at least one of the first, second and third ports.

7. The circuit of claim 1, and further comprising a communications port coupled to the controller that is configured to establish the first and second thresholds.

8. The circuit of claim 1, and further including at least one of a discrete reference voltage, a digital potentiometer, stored memory or a highly precise resistor array that are configured to establish the first and second thresholds.

9. The circuit of claim 1, and further comprising a power converter that is coupled to receive a high input voltage from at least one of the first, second and third ports and convert the voltage to one or more lower level voltages for use by at least the controller.

10. The circuit of claim 9, wherein the power converter further includes a battery port that is configured to be coupled to a battery to provide power to the controller and other low voltage devices in the absence of a voltage at the first, second and third ports.

11. A system, comprising:
    a load;
    a primary power port configured to be coupled to a primary power source;
    a back-up power port configured to be coupled to a back-up power source;
    a power source selection circuit, coupled to the load and the primary and back-up power ports, wherein the power source selection circuit includes:
    at least one power field effect transistor in a first path between the primary power port and the load;
    at least two power field effect transistors in a second path between the back-up power port and the load;
    a dual ideal diode-OR controller, coupled to the at least one power field effect transistor in the first path and a first of the at least two power field effect transistors of the second path;
    a voltage and current sensing circuit; and
    a controller, coupled to a second one of the power field effect transistors in the second path and the voltage and current sensing circuit, wherein the controller is configured to selectively connect and disconnect the back-up power source to and from the load by turning on and off, respectively, the second one of the power field effect transistors in the second path through an opto-isolator in response to the output of the voltage and current sensing circuit.

12. The system of claim 11, wherein the load comprises one of telecommunications circuitry, a remote radio head, remote unit or other circuitry in a distributed antenna system.

13. The system of claim 11, and further comprising a dual diode-OR controller configured to selectively turn on and off the at least one power field effect transistor in the first path and the other of the at least two power field effect transistors in the second path.

14. The system of claim 11, and further including a communications port coupled to the controller, the communications port configured to receive inputs that establish thresholds used by the controller to determine when to turn on and off the one of the power field effect transistors in the first path.

15. The system of claim 11, wherein:
the power source selection circuit comprises a plurality of power source selection circuits;
the load comprises a plurality of loads;
the primary power port comprises a plurality of primary power ports each coupled to a corresponding one of a plurality of primary power sources, each of the primary power ports and each of the plurality of loads associated with a corresponding one of the plurality of power source selection circuits; and
each of the plurality of power source selection circuits is configured to selectively connect the back-up power source to its associated one of the plurality of loads in response to a sensed condition of the corresponding one of the plurality of primary power sources.

16. A method for selecting a power source for a load, the method comprising:
monitoring a primary power source;
when the primary power source is providing power to the load, determining if a condition of the primary power source crosses a first threshold;
when the condition crosses the first threshold,
turning on a first power field effect transistor through an opto-isolator,
under control of a dual ideal diode-OR controller, coupling a back-up power source to the load through a second power field effect transistor and decoupling the primary power source through a third power field effect transistor;
when the primary power source is not providing power to the load, determining if a condition of the primary power source crosses a second threshold;
when the condition crosses the second threshold, switching off the first power field effect transistor through the opto-isolator such that the dual ideal diode-OR controller couples the primary power source to the load through the third power field effect transistor.

17. The method of claim 16, wherein monitoring the primary power source comprises monitoring a voltage level of the primary power source.

18. The method of claim 17, wherein determining if a condition of the primary power source crosses a first threshold comprises determining when a voltage of the primary power source drops below a low voltage threshold.

19. The method of claim 18, wherein determining if a condition of the primary power source crosses a second threshold comprises determining when a voltage of the primary power source rises above a high voltage threshold that is higher than the low voltage threshold.

20. The method of claim 16, and further comprising determining if the back-up power source is providing power to another load prior to turning on the first power field effect transistor.

21. A system for providing sharing a common back-up power source for N loads, the system comprising:
a back-up power port configured to be coupled to the common back-up power source;
a plurality of primary power ports configured to be coupled to N primary power sources;
a plurality of power selection circuits, each coupled to the common back-up power source and at least one of the plurality of primary power ports;
a plurality of load ports, each coupled to one of the plurality of power selection circuits and configured to be coupled to provide power to one of the N loads;
a control line, coupled to each of the plurality of power selection circuits, to communicate when one of the N power selection circuits is coupling the back-up power source to its load;
wherein each of the power selections circuits comprises:
a first port configured to be coupled to one of the N primary power sources;
a second port configured to be coupled to the common back-up power source;
a third port configured to be coupled to provide power to one of the N loads;
first and second power field effect transistors (FET) coupled between the second port and the third port;
a third power FET coupled between the first port and the third port;
a dual ideal diode-OR controller coupled between the second and third power FETs to selectively turn on and off the second and third power FETs;
an opto-isolator coupled to a control input of the first power FET;
a controller, coupled to the opto-isolator, that selectively turns on and off the opto-isolator;
wherein the controller monitors the power received at the first port and, when the power at the first port crosses a first threshold level, turns on the opto-isolator so that power is transmitted by the first and second power transistors between the second port and the third port and when the power at the first port crosses a second threshold level, turns off the opto-isolator so that power is transmitted by the third power transistor between the first port and the third port.

* * * * *